(12) United States Patent
Guo et al.

(10) Patent No.: US 11,910,721 B2
(45) Date of Patent: Feb. 20, 2024

(54) PERPENDICULAR MTJ ELEMENT HAVING A CUBE-TEXTURED REFERENCE LAYER AND METHODS OF MAKING THE SAME

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

( * ) Notice: Subject to any disclaimer, the term of this patent is extended or adjusted under 35 U.S.C. 154(b) by 261 days.

(21) Appl. No.: 17/373,757

(22) Filed: Jul. 12, 2021

(65) Prior Publication Data
US 2023/0012255 A1   Jan. 12, 2023

(51) Int. Cl.
*H10N 50/01* (2023.01)
*H01F 10/32* (2006.01)
*G11C 11/16* (2006.01)
*H10N 50/10* (2023.01)
*H10N 50/80* (2023.01)
*H10N 50/85* (2023.01)

(52) U.S. Cl.
CPC .......... *H10N 50/01* (2023.02); *G11C 11/161* (2013.01); *H01F 10/3272* (2013.01); *H01F 10/3286* (2013.01); *H10N 50/10* (2023.02); *H10N 50/80* (2023.02); *H10N 50/85* (2023.02)

(58) Field of Classification Search
CPC ...................................... H10N 50/01
USPC ............................................. 438/3
See application file for complete search history.

(56) References Cited

U.S. PATENT DOCUMENTS

| | | | | |
|---|---|---|---|---|
| 11,804,321 | B2 * | 10/2023 | Jeong | C23C 14/35 |
| 2006/0044703 | A1 * | 3/2006 | Inomata | G11B 5/3903 |
| 2012/0126905 | A1 * | 5/2012 | Zhang | G11C 11/1675 |
| | | | | 427/130 |
| 2013/0175644 | A1 * | 7/2013 | Horng | B82Y 40/00 |
| | | | | 257/E29.323 |
| 2021/0233576 | A1 * | 7/2021 | Xiao | H10N 50/85 |
| 2023/0039108 | A1 * | 2/2023 | Guo | H10N 50/80 |

* cited by examiner

*Primary Examiner* — Jami Valentine Miller (57) ABSTRACT

The invention comprises a method of forming a novel magnetic pinning structure having a (100) textured or cube-textured reference layer through a non-epitaxial texturing approach so that an excellent coherent tunneling effect is achieved in a pMTJ element due to its texture structure of CoFe BCC (100)/MgO rocksalt (100)/CoFe BCC (100). Correspondingly, a high MR ratio and a high pinning strength on the reference layer can be achieved for perpendicular spin-transfer-torque magnetic-random-access memory (pSTT-MRAM) using perpendicular magnetoresistive elements as basic memory cells which potentially replace the conventional semiconductor memory used in electronic chips, especially mobile chips for power saving and non-volatility.

20 Claims, 3 Drawing Sheets

PERPENDICULAR MTJ ELEMENT HAVING A CUBE-TEXTURED REFERENCE LAYER AND METHODS OF MAKING THE SAME

BACKGROUND OF THE INVENTION

1. Field of the Invention

This invention relates to the field of perpendicular magnetoresistive elements. More specifically, the invention comprises perpendicular magnetic tunnel junctions (pMTJs) having a cube-textured reference layer to enhance both coherent tunneling effect and magnetic pinning for spin-transfer-torque (STT) or spin-orbit-torque (SOT) magnetic-random-access memory (MRAM) using perpendicular magnetoresistive elements as basic memory cells which potentially replace the conventional semiconductor memory used in electronic chips, especially mobile chips for power saving and non-volatility.

2. Description of the Related Art

In recent years, spin-transfer torque magnetic random access memories (hereinafter referred to as STT MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a free layer having a changeable magnetization direction, an insulating spacing layer, and a fixed reference layer that is located on the opposite side from the free layer and maintains a predetermined magnetization direction. The insulating spacing layer serves as a tunneling barrier (TB) in a ferromagnetic tunnel junction. In a SOT MRAM, there is an additional SOT layer immediately located on a surface of the free layer, which is opposite to a surface of the free layer where the insulating spacing layer is provided. SOT can be a thin layer made of heavy transition metal layer such as W or Ta, Pt, etc., or a layer of topological insulating material such as BiSB.

As a write method to be used in such magnetoresistive elements of a STT MRAM, there has been suggested a write method (spin-transfer torque switching technique) using spin momentum transfers. According to this method, the magnetization direction of a free layer is reversed by applying a spin-polarized current along a certain direction to the magnetoresistive element. Furthermore, as the volume of the magnetic layer forming the free layer is smaller, the injected spin-polarized current to write or switch can be also smaller. Accordingly, this method is expected to be a write method that can achieve both device miniaturization and lower currents. In a SOT MRAM, an electric current flows in the SOT layer, which is a paramagnetic layer, to generate a spin-polarized current and inject it into its adjacent free layer, which is a ferromagnetic layer. The spin-polarized current then exerts a torque on the magnetic moment to reverse it.

Further, as in a so-called perpendicular magnetic tunnel junction (pMTJ) element, both two magnetization films, i.e., the free layer and the reference layer, have easy axis of magnetization in a direction perpendicular to the film plane due to their strong magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

Perpendicular spin-transfer torque magnetic random-access memory (pSTT-MRAM) based upon above pMTJ elements is an attractive alternative to existing memory-storage technologies because of its high performance, nonvolatility and scalability. MgO-based magnetic tunnel junctions (MTJs) having a highly textured sandwich structure: BCC (100) CoFe (reference layer)/rocksalt (100) MgO (tunnel barrier layer)/BCC (100) CoFe (free layer), exhibit high magnetoresistance (MR) ratios due to the so-called coherent tunneling effect and are considered to be essential for pSTT-MRAMs. MTJs having perpendicular magnetic anisotropy (PMA) enable low switching-current densities required for magnetization reversal and high thermal stabilities of the storage cells. A magnetic stack with an out-of-plane magnetization is energetically unfavorable because of its strong demagnetizing fields, and therefore strong PMA is essential, in the form of either intrinsic magnetocrystalline anisotropy or interface effects.

There has been a known technique for achieving a high MR ratio in a pMTJ element by forming an underneath MgO tunnel barrier layer and a BCC (body centered cubic) or HCP (hexagonal close-packed crystal)-phase cap layer that sandwich a thin free layer (FL) having an amorphous CoFeB ferromagnetic film and accelerate crystallization of the amorphous ferromagnetic film to match interfacial grain structure to MgO layer through a thermal annealing process. The film of the MgO tunnel barrier layer is polycrystalline, with each grain oriented such that the (100) crystallographic direction is parallel to the film normal, which is also called (100) texture. The FL crystallization starts from the tunnel barrier layer side to the cap layer and forms a BCC (body centered cubic) CoFe grain structure having a perpendicular magnetic anisotropy, as Boron elements migrate into the cap layer. Similarly, a thin reference layer (RL), that is located on the opposite side from the free layer, is sandwiched between the MgO tunnel barrier layer and an underneath Boron-absorbing layer having a BCC or HCP phase, and during the same thermal annealing process, the RL crystallization starts from the tunnel barrier layer side to the Boron-absorbing layer and forms a BCC CoFe grain structure having a perpendicular magnetic anisotropy, as Boron elements migrate into the Boron-absorbing layer. Accordingly, a coherent perpendicular magnetic tunnel junction structure having a (100) textured structure of CoFe BCC (100)/MgO rocksalt (100)/CoFe BCC (100) is formed. By using this technique, a high MR ratio can be achieved. Here, and thereafter throughout this application, each element written in the left side of "/" is stacked below an element written in the right side thereof.

In order to maintain a predetermined magnetization direction for the RL layer, a high perpendicular magnetic anisotropy (PMA) material must be provided underneath the Boron-absorbing layer that is typically no more than 0.3 nm and magnetically coupled to the RL layer to pin the magnetization of the RL in a predetermined perpendicular direction. A layer made of a high perpendicular magnetic anisotropy (PMA) material is also called as a pinning layer. A conventional method of forming such a pinning layer is briefly summarized as follows. First, a buffer layer is provided on top of a bottom electrode and comprises a property that inhibits a propagation of a crystalline structure of the bottom electrode into the high perpendicular magnetic anisotropy (PMA) material, and a seed layer is provided on top of the buffer layer and promotes a desired crystalline orientation growth for the high perpendicular magnetic anisotropy (PMA) material. The crystalline orientation along the growth axis (e.g., the texture) should be uniform between the seed layer and the high perpendicular magnetic anisotropy (PMA) material. The texture may be measured in a material by using x-ray diffraction, and the terms "high" or "good" texture may be used to describe uniform crystalline orientation along the growth axis that has a certain crystalline symmetry perpendicular to the plane. Typically, a magnetic material may exhibit a special crystalline axis in which the magnetization prefers to be directed, referred to herein as an "easy axis." Therefore, if a strong PMA is desired, the direction of crystal growth, or the growth axis, extends in the same direction as the direction in which the easy axis points. The direction of the crystal growth is important not only for providing a strong PMA in the magnetic crystalline material, but also for providing a strong PMA at an interface of a crystalline material.

Materials in the first category, displaying intrinsic magneto-crystalline anisotropy, include L10-based materials such as FePt L10 superlattice, and those in the second category, containing interface effects, include $(Co/X)_n$ multilayer structures, where X represents Pt, Pd or Ni metals, and n is the number of repetitions. More specifically, in the case of $(Co/Pt)_n$, its FCC (face centered cubic) (111) crystal orientation direction achieves the highest PMA from the crystalline point of view and also from the interface anisotropy point of view, while in the case of FePt L10 superlattice, its (100) crystal orientation direction (texture direction) achieves the highest PMA for the FePt material. $(Co/X)_n$ multilayer structures have two distinct advantages over L10 materials: (1) their close-packed growth plane makes them easier to fabricate, and (2) their simpler stack design, which accommodates a choice of thicknesses of the constituent layers, of n, and of X, allows much greater versatility. And more, since forming of FePt L10 superlattice requires a thermal annealing at a very high temperature (typically above 600 degrees Celsius) as in a conventional method which would cause damage to the underneath integrated CMOS circuitry, a popular choice of high perpendicular magnetic anisotropy (PMA) material is $(Co/X)_n$. However, $(Co/X)_n$ multilayer structures have two significant shortcomings that undermine their application to pSTT-MRAM devices. First, their PMA properties deteriorate or even disappear when the multilayer structures are subjected to temperatures as low as 300° C. Second, because their close-packed growth plane has an FCC (111) texture, it is difficult to form a BCC (100) textured CoFe reference layer directly upon it. It is noted that a BCC (100) textured CoFe is essential for a high MR ratio.

Due to the fact that a desired reference layer (RL) texture is BCC (100) of 4-fold symmetry and a desired high perpendicular magnetic anisotropy (PMA) material $(Co/X)_n$ texture is FCC (111) of 3-fold symmetry, a texture breaking layer must be provided between the RL and the PMA material, that inhibits a propagation of the FCC (111) texture of $(Co/X)_n$ into the RL. Fortunately, many Boron-absorbing materials, such as W, Mo and Ta, are also good texture breaking materials having BCC crystalline structures, and therefore these materials are widely used as a thin texture-breaking Boron absorbing (TBBA) layer inserted between a reference layer made of amorphous CoFeB and a pinning layer made of FCC (111) PMA material. The TBBA layer is thin enough so that the magnetization of the reference layer is strongly parallel-coupled to the magnetization of the pinning layer in order to yield high temperature thermal stability (usually up to about 400 degrees Celsius).

Figure 1:
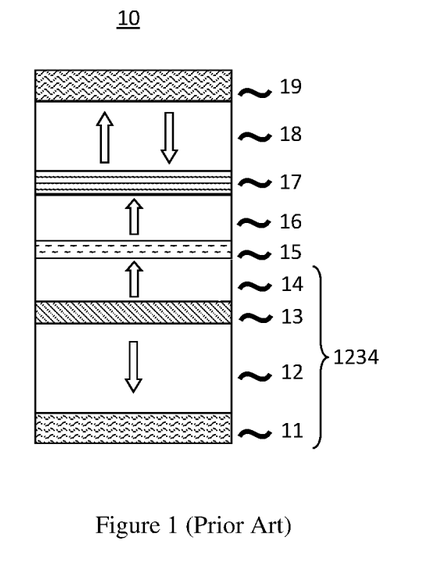
FIG. 1 shows a schematic representation of a typical pMTJ element 10 in the prior art.

A conventional pMTJ element comprises a magnetic pinning structure (PS), a tunnel barrier (TB), and a magnetic free layer (FL), wherein the PS is formed by sequentially depositing a perpendicular synthetic anti-ferromagnetic (pSAF) stack, a TBBA layer and a CoFeB reference layer. Further, a commonly used pSAF stack has the structure: seed-layer/$(Co/X)_m$/Co/Y/Co/$(X/Co)_n$, where X represents Pt, Pd or Ni metals, m and n are integers (normally m>n), and Y represents a Ru (or Rh, Tr) metal spacer that provides a perpendicular RKKY coupling between the two magnetic multilayer structures $(Co/X)_m$/Co and Co/$(X/Co)_n$. As a prior art, the conventional full film pMTJ element (100) is illustrated in FIG. 1 which starts on a substrate (not shown here) and consists of a perpendicular synthetic anti-ferromagnetic (pSAF) stack (1234) consisting of a seed layer of Pt (11), a lower multilayer structure $(Co/Pt)_m$/Co (12), a spacer made of Ru (or Rh, Ir) (13) and an upper multilayer structure Co/$(Pt/Co)_n$ (14), a TBBA layer made of W, Mo or Ta (15), a reference layer made of amorphous CoFeB (16), a TB made of MgO (17), a FL comprising CoFeB (18) and a cap layer (19). It is important that the TBBA layer has to be made of a material offering good solubility of boron and/or offering a low boron alloy temperature, to advantageously absorb boron during a post-deposition anneal, thereby reducing the presence of boron at the interface between the RL layer 16 and the tunnel-barrier layer 17. The TBBA layer may be made of a nonmagnetic material comprising W, Mo, Fe, Ta, Mg, Zr, Nb, Hf, Ti, Cr, V, Bi, or any combination thereof. It has also been proposed (see U.S. Pat. Nos. 10,446,205 and 9,595,666) that the TBBA layer may be made of magnetic material such as CoFeX, FeX and CoX, or be made of multilayer structure such as CoFeB/X, CoFe/X, FeB/X, FeIX and CoB/X, where X represents W, Mo or Ta.

The purpose of inserting a traditional texture breaking layer having BCC crystalline structure, such as Mo, W and Fe, between the PMA material and the reference layer is to allow the crystalline transition between the FCC (111) textured PMA of 3-fold symmetry and the BCC CoFe next to the MgO barrier. However, the material of the texture breaking layer preferably forms BCC (110) texture instead of the desired BCC (100) texture which has 4-fold symmetry, due to both of the lattice-matching epitaxial growth at FCC (111)/BCC (110) metal interfaces and the BCC (110) being its close-packed plane, in fact, the distances between the neighboring atoms in the Mo BCC (110) unit cell are 3.147 Å/2.72 Å/2.72 Å, respectively; the distances between the neighboring atoms in the W BCC (110) unit cell are 3.16 Å/2.74 Å/2.74 Å, respectively; and the distances between the neighboring atoms in the Fe BCC (110) unit cell are 2.867 Å/2.48 Å/2.48 Å, respectively, all of which have small lattice misfits with the lattice constant 2.69 Å of the $[Co/Pt]_n$, surface unit cell (primitive FCC (111) unit cell). The BCC (110) texture in these texture breaking layers would further result in an undesirable, close-packed BCC (110) texture in the CoFe reference layer upon it. To mitigate this problem, an amorphous CoFeB has to be used to replace CoFe as a reference layer material, and the rocksalt (100) textured MgO tunnel barrier layer helps CoFeB crystallization and forms BCC (100) CoFe grain structures in a thermal annealing process. However, due to the undesired BCC (110) textured breaking layer, the reference layer has a mixed texture of BCC (100) and (110) grains after a thermal annealing process. For this reason, an amorphous texture breaking layer, such as FeTa, FeTi and FeZr (see U.S. Pat.

No. 9,755,140), has been proposed to suppress crystallization at the interface between the texture breaking layer and the CoFeB reference layer, while only the rocksalt (100) textured MgO tunnel barrier layer helps CoFeB crystallization during annealing. However, the amorphous material of the texture breaking layer may change into nano-crystalline during a thermal annealing process, which would also lead to a certain amount of BCC (110) texture grains in the CoFeB reference layer. And more seriously, Ta, Ti and Zr atoms easily diffuse into MgO via Mg substitutional sites even at room temperature, which would cause a degradation of MR ratio.

There is a different technique proposed by S. Parkin (see U.S. Pat. No. 7,357,995) to form a coherent magnetic tunnel junction structure having a texture structure of CoFe BCC (100)/MgO rocksalt (100)/CoFe BCC (100). In this method, before deposition of the first CoFe layer, a special seed layer, IrMn layer, grows highly oriented in the (100) orientation when deposited on a buffer layer of Ta or TaN/Ta that is first deposited on a substrate of an amorphous material such as SiO2. Using this combination of under-layers, the CoFe layer is textured in the (100) orientation and the MTJ displays a high MR ratio. However, the total thickness of the combined under-layers, or similar type of seed layer structure, is too large to make the reference layer magnetization strongly coupled to the pinning layer magnetization, and moreover, the IrMn layer, as an anti-ferromagnetic material (AFM), would pin the magnetization of the reference layer in an in-plane direction, which disqualifies this technique for perpendicular pMTJ elements.

It is very challenging but desirable to develop a (100)-textured (i.e., cube-textured) layer to replace the traditional BCC (110)-textured TBBA layer in order to achieve a highly BCC (100) textured RL which is strongly pinned by the pSAF through magnetic exchange coupling. This (100)-textured layer must have a self-assembling capability to form a (100) texture through a non-epitaxial texturing method.

SUMMARY OF THE PRESENT INVENTION

An objective of the disclosed invention is to solve the above-disclosed challenges faced by pMTJ elements, especially magnetic pinning structures. Further and/or alternative objectives may be understood from the following.

One preferred embodiment is a pMTJ element comprising a magnetically fixed pinning structure that consists of a perpendicular synthetic anti-ferromagnetic (pSAF) stack, an oxide buffer (OB) layer and a cube-textured reference layer, wherein the pSAF stack includes a FCC (111) PMA material multilayer such as seed-layer/$(Co/X)_m$/Co/Y/Co/$(X/Co)_n$, where X represents Pt, Pd or Ni metals, m and n are integers (normally m>n), and Y represents a Ru (or Rh, Ir) metal spacer, and the cube-textured reference layer includes a texture starting (TS) layer and a spin polarization (SP) layer. Both of the TS layer and the SP layer are made of materials selected from the group consisting of ferromagnetic materials and ferrimagnetic materials. The TS layer comprises either a highly BCC (100) textured material or a L10 superlattice (100) textured material. The SP layer comprises a highly BCC (100) textured material. The OB layer sandwiched between the pSAF stack and the cube-textured reference layer is thin enough to produce a strong magnetic parallel-coupling between the reference layer and the pSAF stack, so that the cube-textured reference layer is pinned in a predetermined perpendicular direction. The TS layer comprises at least one of an iron (Fe) layer, a cobalt (Co) layer, an alloy layer of iron cobalt (FeCo), a laminated layer of $(Fe/Co)_n$, an alloy layer of FeX, a laminated layer of $(Fe/X)_n$, where X represents Pt or Pd metals, and n is the number of laminates in the stack, and is highly (100) textured through a non-epitaxial texturing method. The SP layer comprises at least one of an iron (Fe) layer, a cobalt (Co) layer, an alloy layer of cobalt iron (CoFe), a laminated layer of $(Co/Fe)_n$, where n is the number of laminates in the stack.

The OB layer is formed by depositing an oxide layer, or by sequentially depositing a metal layer and oxidizing the metal layer. Alternatively, the oxide buffer layer may advantageously be formed by oxidizing the top surface of the pSAF immediately after the formation of the pSAF stack. In general, the OB layer has a thickness no more than 10 angstroms, preferably no more than 5 angstroms. The OB layer may strongly exchange couple the two magnetic moments that sandwich the OB layer so that their magnetization directions are parallel. The TS layer is formed by direct deposition on the OB layer and subsequent rapid thermal annealing (RTA) or fast quenching (FQ) Alternatively, the TS layer is formed by direct deposition on the OB layer with an ultra-low deposition rate of no more than 0.5 angstrom per second and subsequent thermal annealing in hydrogen atmosphere. In general, the TS layer is highly (100) textured, and the SP layer grows epitaxially on the TS layer and is highly BCC (100) textured.

The pMTJ element further comprises a tunnel barrier directly on top of the cube-textured reference layer to permit spin-polarized current to pass between the tunnel barrier and the cube-textured reference layer, and a magnetic free layer directly on top of the tunnel barrier, so that the element forms a pMTJ junction. In one preferred embodiment, the free layer includes two BCC magnetic sub-layers that each includes material selected from the group consisting of ferromagnetic materials and ferrimagnetic materials; the free layer further includes one non-magnetic spacer layer between the two BCC magnetic sub-layers, in which the non-magnetic spacer layer exchange couples the two BCC magnetic sub-layers. The pMTJ element may contain no boron. The tunneling magnetoresistance of the junction may be at least 150%, or even at least 200% at room temperature.

Another preferred embodiment is a pMTJ element comprising a magnetically fixed pinning structure that consists of a perpendicular synthetic anti-ferromagnetic (pSAF) stack, an oxide buffer (OB) layer and a cube-textured reference layer that contains Boron, wherein the pSAF stack includes a FCC (111) PMA material multilayer such as seed-layer/$(Co/X)_m$/Co/Y/Co/$(X/Co)_n$, where X represents Pt, Pd or Ni metals, m and n are integers (normally m>n), and Y represents a Ru (or Rh, Ir) metal spacer, and the cube-textured reference layer includes a texture starting (TS) layer and a spin polarization (SP) layer. The TS layer includes a material selected from the group consisting of ferromagnetic materials and ferrimagnetic materials, while the SP layer includes an amorphous material that contains Boron and selected from the group consisting of ferromagnetic materials and ferrimagnetic materials. The TS layer comprises a highly BCC (100) textured material or a L10 superlattice (100) textured material. The SP layer comprises a highly BCC (100) textured material. The OB layer sandwiched between the pSAF stack and the cube-textured reference layer is a magnetic oxide, such as iron oxide or cobalt oxide, which produces a strong magnetic parallel-coupling between the reference layer and the pSAF stack. The TS layer comprises at least one selected from the group consisting of Fe/Y, FeCo/Y, $(Fe/Co)_n$/Y, $(Fe/Co)_n$/Fe/Y, (Fe/

X)$_n$/Y and (Fe/X)$_n$/Fe/Y, where X represents Pt or Pd metals, Y represents W, Mo, Mg, Ta, or other Boron absorbing metals, and n is a positive integer, and is highly (100) textured through a non-epitaxial texturing method. The SP layer comprises an alloy layer of iron boron (FeB), an alloy layer of cobalt boron (CoB), an alloy layer of cobalt iron boron (CoFeB), or a combination thereof, where the composition of B is between 15% and 30%.

The perpendicular synthetic anti-ferromagnetic (pSAF) stack with a very strong PMA comprises a first magnetic pinning (FPL) layer having a FCC (111) textured crystalline structure and a second magnetic pinning (SPL) layer having a FCC (111) textured crystalline structure which sandwich a non-magnetic anti-ferromagnetic coupling (AFC) layer of Ru (or Rh, Ir) and are coupled into anti-parallel magnetization states through a very strong RKKY exchange interaction.

The application of said pMTJ element comprising above novel pinning structure includes pSTT-MRAM as well as SOT-MRAM. Said pMTJ element in the invention is further sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

DETAILED DESCRIPTION OF THE INVENTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Here, and thereafter throughout this application, each element written in the left side of "/" is stacked above an element written in the right side thereof.

In the invention, we propose a novel non-epitaxial growth method to fabricate a thin (100) textured starting (TS) layer over an oxide buffer (OB) layer, atop of a highly FCC (111) textured pSAF stack, which would later lead to epitaxial growth of a highly BCC (100) textured spin polarization layer.

In general, there is provided a pMTJ element comprising: a magnetically fixed pinning structure, a tunnel barrier layer and a magnetic free layer. The pinning structure consists of a perpendicular synthetic anti-ferromagnetic (pSAF) stack, an oxide buffer (OB) layer and a cube-textured reference layer. The pSAF stack includes a FCC (111) PMA material multilayer such as seed-layer/(Co/X)$_m$/Co/Y/Co/(X/Co)$_n$, where X represents Pt, Pd or Ni metals, m and n are integers (normally m>n), and Y represents a Ru (or Rh, Ir) metal spacer. The cube-textured reference layer comprises a texture starting (TS) layer and a spin polarization (SP) layer.

The TS layer includes a crystalline material selected from the group consisting of ferromagnetic materials and ferrimagnetic materials, while the SP layer, as deposited, includes a crystalline material or an amorphous material selected from the group consisting of ferromagnetic materials and ferrimagnetic materials. The TS layer comprises a highly BCC (100) textured material or a L10 superlattice (100) textured material after applying a non-epitaxial texturing method. The SP layer comprises a highly BCC (100) textured material. The thickness of the OB layer sandwiched between the pSAF stack and the cube-textured reference layer is thin enough to produce a strong magnetic parallel-coupling between the reference layer and the pSAF stack, so that the magnetization of the reference layer is pinned in a predetermined perpendicular direction. The TS layer comprises at least one selected from the group consisting of Fe, FeCo, Co, FeX, $(Fe/Co)_n$, $(Fe/X)_n$, Fe/Y, FeCo/Y, $(Fe/Co)_n$/Y, $(Fe/Co)_n$/Fe/Y, $(Fe/X)_n$/Y and $(Fe/X)_n$/Fe/Y, where X represents Pt or Pd metals, Y represents W, Mo, Mg, Ta, or other Boron absorbing metals, and n is a positive integer, and is highly (100) textured by applying a non-epitaxial texturing method. The SP layer includes at least one element selected from Fe, Co and B, and preferably comprises at least one selected from the group consisting of Fe, Co, CoFe, $(Fe/Co)_n$, $(Fe/CoFe)_n$, $(Co/Fe)_n$, $(Co/CoFe)_n$, $(CoFe/Fe)_n$, $(CoFe/Co)_n$, $(Fe/Co)_n$/Fe, $(Fe/Co)_n$/CoFe, $(Fe/CoFe)_n$/Fe, $(Fe/CoFe)_n$/Co, $(Co/Fe)_n$/CoFe, $(Co/Fe)_n$/Co, $(Co/CoFe)_n$/Co, $(Co/CoFe)_n$/Fe, $(CoFe/Fe)_n$/Co, $(CoFe/Fe)_n$/CoFe, $(CoFe/Co)_n$/Fe, $(CoFe/Co)_n$/CoFe, CoFe/$(Fe/Co)_n$, Co/$(Fe/CoFe)_n$, CoFe/$(Co/Fe)_n$, Fe/$(Co/CoFe)_n$, Co/$(CoFe/Fe)_n$, Fe/$(CoFe/Co)_n$, FeB, CoB, FeB/Fe, CoB/Fe, FeB/Co, CoB/Co, FeB/CoFe, CoB/CoFe, CoFeB, CoFeB/Fe, CoFeB/Co and CoFeB/CoFe, where n is a positive integer.

The OB layer is formed by depositing an oxide layer, or by sequentially depositing a metal layer and oxidizing the metal layer. Alternatively, the OB layer may advantageously be formed by oxidizing the top surface of the pSAF immediately in an oxidization chamber after the formation of the pSAF stack. In general, it is preferred that the OB layer is a magnetic oxide, such as FeO, CoO and $FeCoO_2$, and has a thickness no more than 10 angstroms. The OB layer may strongly exchange couple the two magnetic moments that sandwich the OB layer so that their magnetization directions are parallel. The TS layer is formed by direct deposition on the oxide buffer layer and subsequent rapid thermal annealing (RTA) or fast quenching (FQ). The RTA or FQ can be conducted in-situ in a special chamber attached to a deposition system. As an iron rich layer is deposited directly over an oxide, Fe atoms get oxidized or partially oxidized on the surface, and a strong tensile stress is induced in the film plane, which is caused by interaction between Fe monolayers and FeO. A sufficiently strong tensile strain in Fe film plane favors a BCC (100) texture. A rapid thermal annealing (RTA), in which lamps are used to heat a substrate quickly to high temperatures, induces an extra tensile strain in the film plane of the iron rich layer. The tensile strains from Fe/FeO interface and the RTA are added together, as a non-epitaxial texturing mechanism, and freeze the Fe film in the (100) texture. For a TS layer made of Fe or CoFe thin film deposited directly on an OB layer, a BCC (100) texture is promoted with the tensile strain in the film plane by performing the RTA within a proper heating/cooling rate range. For a TS layer made of $(Fe/Pt)_n$, thin film deposited directly on an OB layer, an L10 superlattice (100) texture is promoted with the tensile strain in the film plane by performing the RTA within a proper heating/cooling rate range. Alternatively, the TS layer is formed by direct deposition on the OB layer with an ultra-low deposition rate of no more than 0.5 angstrom per second and subsequent thermal annealing in hydrogen atmosphere. The thermal annealing in hydrogen atmosphere can be conducted in-situ in a special thermal annealing chamber attached to a deposition system. In general, the TS layer is highly (100) textured, and the SP layer grows epitaxially on the TS layer and is highly BCC (100) textured.

Thin-film deposition methods offer the ability to control crystalline texture through epitaxial relationships with the substrate or a seed layer, and common deposition methods include molecular beam epitaxy (MBE), electron-beam (E-beam) evaporation, pulse-laser deposition (PLD) and plasma sputtering. Sputter deposition is the simplest method and widely used in labs and manufacturing industry, and normally sputtering rates are variable, ranging from slower than 1 Å/s to as fast as ~1 μm/min.

The structure and morphology of a sputtered thin film can also change significantly during growth depending on substrate type and temperature, the available kinetic energy and the current state of the film. Theoretically, high adatom mobility and active surface diffusion allow a growing film to rearrange into energy minimizing configurations and achieve near-equilibrium structures. However, the ability to reconfigure is lost for fast deposition rates, and the film growth is said to be quenched if atomic mobility is too low or the deposition rate too high. Quenched growth modes or low substrate temperatures can kinetically inhibit energy-minimizing processes, yielding highly non-equilibrium as-deposited structures. Grain growth, coalescence, and defect elimination can induce in-plane tensile strain, relaxing any compressive strain and in some cases leading to a residual tensile strain state. Due to the non-equilibrium nature of magnetron sputtering it is often necessary to employ post-deposition processing to achieve a desired phase or microstructure. In another word, preferential grain growth occurs when there exists a larger driving force, such as additional in-plane strain, for the growth of one particular grain configuration of over any other. Such preferred configurations originate from large surface energy anisotropies or variable strain states of the growing crystallites. Besides, a close epitaxial relationship between the film and substrate or preceding layer can alter the strain in the growing film. Mismatched lattices lead to large strains as the film continues to grow. Both preferential and epitaxial growth can yield crystallographic texture. A rapid thermal anneal with high heating rates induces additional in-plane strain, activates diffusion, promotes grain growth and re-crystallization, and accelerates equilibration through enhanced kinetics. In fact, RTA is a class of techniques, including a spike annealing and a flash light annealing, that provide a way to rapidly anneal wafers to elevated temperatures for relatively short times, usually less than a minute. The heating is accomplished optically. An RTA system typically processes wafers singly and is capable of achieving process temperature of ~200-1300° C. with a wide range of ramp rates ~20-250° C. per second. Besides RTA, fast quenching processes include a laser quenching, an induction quenching, a flame quenching and a carburizing quenching. Among them, the laser quenching has a high power density and fast heating/cooling rates, which would also serve the same purpose as the RTA. In another word, the TS layer can also be formed by direct deposition on the oxide buffer layer and subsequent laser quenching or other fast quenching (FQ) process.

While metal films and adjacent oxide films are thin, epitaxial relationship is generally maintained between them. The perfect epitaxy cannot, however, be expected because of the lattice mismatch between them, thus the both lattices are strained. For an iron thin film growing over a ferrous oxide (FeO) thin film, a tensile strain is induced in the Fe film, although the FeO lattice contracts to some extent, i.e., the FeO is in compression and correspondingly the Fe film is in tension. Fe films completely cover oxide substrates for thicknesses of a few ML, indicating that Fe "wets" the surface better than other elements such as Cu. The ability of the metal film to cover (wet) the oxide substrate correlates directly with the reactivity of the metal toward oxygen. For Fe films, there is a strong interaction between the films and the oxide substrate, i.e., oxidation of the metal over-layers and reduction of the substrate, at sub-monolayer thickness. Moreover, a rapid thermal annealing (RTA), or a laser quenching, induces a strong tensile strain in Fe thin films on oxide substrate, and promotes (100) ordering in Fe films. In another word, after a RTA or a laser quenching, a thin Fe film on an oxide substrate freezes in a (100) preferred orientation. Similarly, this is also true for CoFe to obtain BCC (100) orientation, and for FePt to obtain L10 ordering as well as (100) orientation.

Figure 2:
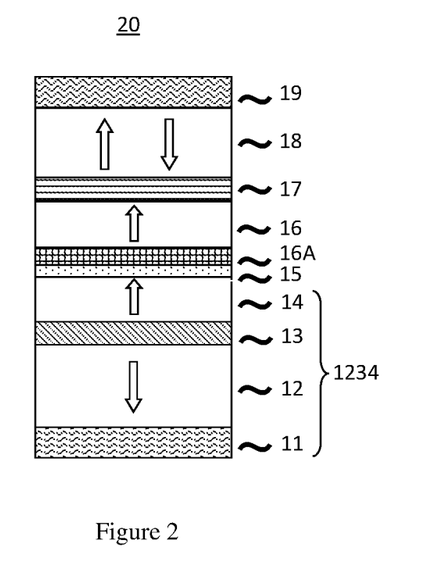
FIG. 2 shows a schematic drawing of layer configuration of a pMTJ element 20 comprising an oxide buffer layer sandwiched between a pSAF stack and a cube-textured reference layer according to an embodiment of the invention.

FIG. 2 shows a schematic drawing of layer configuration of a pMTJ element 20 comprising an oxide buffer and a cube-textured reference layer, which are together sandwiched between a pSAF stack and a tunnel barrier layer, according to the invention. The pMTJ element comprises a perpendicular synthetic anti-ferromagnetic (pSAF) stack (1234), an oxide buffer layer (15), a cube-textured reference layer consisting of a textured starting layer (16A) and a spin polarization layer (16B), a tunnel barrier (17), a free layer (18) and a cap layer (19), wherein the pSAF stack (1234) consisting of a seed layer (11), a lower multilayer structure (12), an anti-ferromagnetic coupling (AFC) spacer (13) and an upper multilayer structure (14). The AFC spacer (13) provides RKKY magnetic coupling between the magnetic lower multilayer structure (12) and the magnetic upper multilayer (14). Similar to the prior art, the pSAF stack has a strong PMA from the same stack, however it is the OB layer (15) that replaces the TBBA layer and offers the cube-textured reference layer (16A, 16B) a stronger magnetic coupling to the pSAF and correspondingly a stronger pinning field. And moreover, the TS layer serves as a highly (100) textured seed layer for the SP layer to achieve a BCC (100) texture through an epitaxial growth, which is crucial for a high MR ratio.

Figure 3:
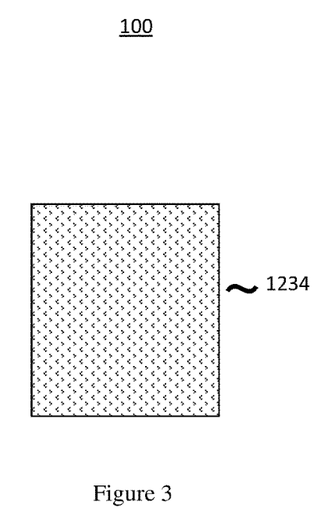
FIG. 3 is a cross-sectional view showing a configuration of a pMTJ element 100 after forming the pSAF stack.
Figure 4A:
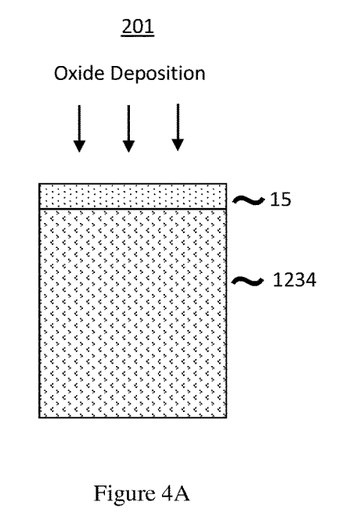
FIG. 4A is a cross-sectional view showing a configuration of a pMTJ element 201 after depositing the oxide buffer layer on top of the pSAF stack, according to the first embodiment.
Figure 4B:
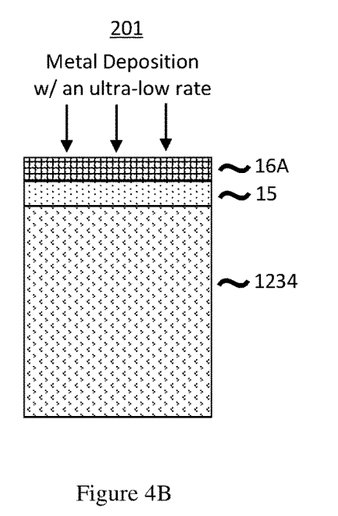
FIG. 4B is a cross-sectional view showing a configuration of a pMTJ element 201 after depositing the texture starting layer with an ultra-low deposition rate on top of the oxide buffer layer, according to the first embodiment.
Figure 5A:
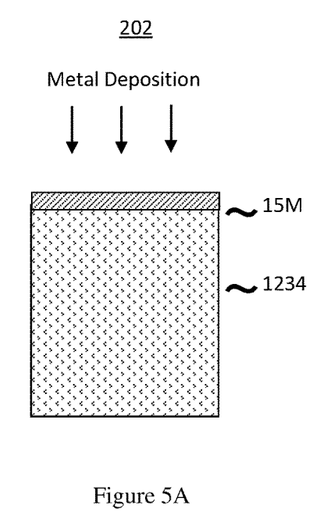
FIG. 5A is a cross-sectional view showing a configuration of a pMTJ element 202 after depositing an intermediate metal layer on top of the pSAF stack, according to the second embodiment.
Figure 5B:
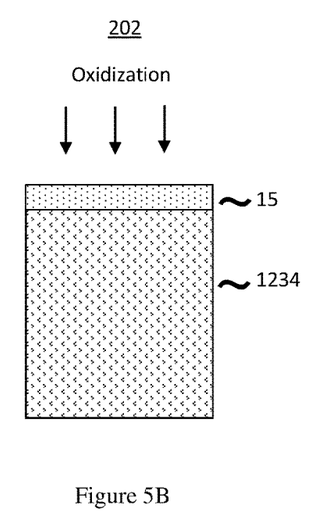
FIG. 5B is a cross-sectional view showing a configuration of a pMTJ element 202 after forming the oxide buffer layer by oxidizing the intermediate metal layer, according to the second embodiment.
Figure 5C:
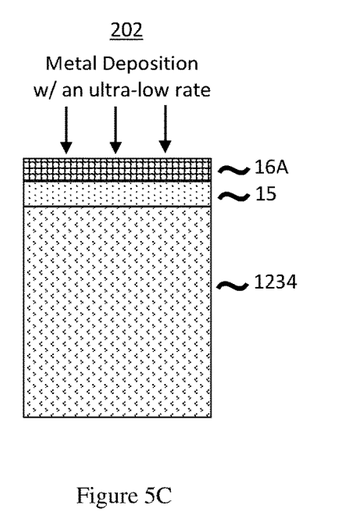
FIG. 5C is a cross-sectional view showing a configuration of a pMTJ element 202 after depositing the texture starting layer with an ultra-low deposition rate on top of the oxide buffer layer, according to the second embodiment.
Figure 6A:
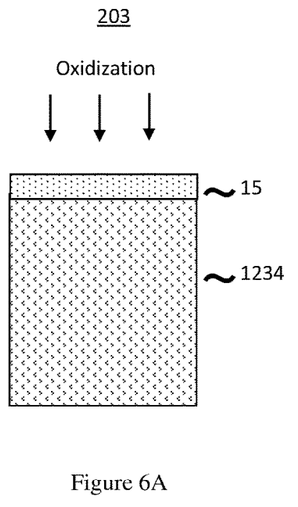
FIG. 6A is a cross-sectional view showing a configuration of a pMTJ element 203 after forming the oxide buffer layer by oxidizing the top surface of the pSAF stack, according to the third embodiment.
Figure 6B:
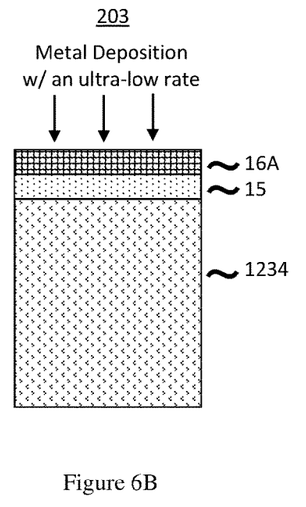
FIG. 6B is a cross-sectional view showing a configuration of a pMTJ element 203 after depositing the texture starting layer on top of the oxide buffer layer, according to the third embodiment.

In next sections, three embodiments of manufacturing pMTJ elements according to this invention are present. FIGS. 3, 4(A, B) and 7-10 show some key processing steps in the first embodiment of forming a pMTJ element having a boron-free cube-textured reference layer. FIGS. 3, 5(A, B, C) and 7-10 show some key processing steps in the second embodiment of forming a pMTJ element having a cube-textured reference layer. FIGS. 3, 6(A, B) and 7-10 show some key processing steps in the third embodiment of forming a pMTJ element having a cube-textured reference layer. In all above three embodiments, the first step is forming a pSAF stack, as shown in FIG. 3. The pSAF stack (1234) includes a FCC (111) PMA material multilayer such as seed-layer/(Co/X)$_m$/Co/Y/Co/(X/Co)$_n$, where X represents Pt, Pd or Ni metals, m and n are integers (normally m>n), and Y represents an AFC spacer made of Ru, Ir or Rh. One or two additional CoFe thin layer(s) may be inserted immediately adjacent to the AFC spacer for further enhancement of the RKKY coupling strength.

First Embodiment of Forming a pMTJ Element having a Cube-textured Reference Layer After forming the pSAF stack (1234), an OB layer (15) is deposited on top of the pSAF, as shown in FIG. 4A. The material for the OB layer can be one selected from the group consisting of SiO2, BOx, SOx, AlOx, alkaline metal oxides and transition metal oxides. Preferably, the OB layer is made of an oxide having rocksalt crystalline structure, such as NiO, CoO, FeO, FeCoO$_2$, NiFeO$_2$, CoNiO$_2$, MnO, VO, CrO, TiO, MgO, MgZnO, ZnO, CdO. The thickness of the OB layer is no more than 1.0 nm, preferably no more than 0.5 nm.

Figure 7:
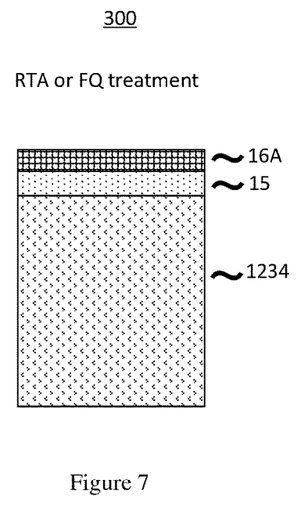
FIG. 7 is a cross-sectional view showing a configuration of a pMTJ element 300 after performing a rapid thermal annealing (RTA) process or a fast quenching (FQ) process on the texture starting layer.

FIG. 4B is a cross-sectional view showing a configuration of an MTJ element 201 after depositing the TS layer (16A) with an ultra-low deposition rate on top of the OB layer (15), according to the first embodiment. The TS layer is preferred to be one selected from the group consisting of Fe, FeCo, Co, (Fe/Co)$_n$ and (Fe/Pt)$_n$. The TS layer is formed by direct deposition on the OB layer with an ultra-low deposition rate of no more than 0.5 angstrom per second, preferably, with an ultra-low deposition rate of no more than 0.1 angstrom per second. After depositing the TS layer, a rapid thermal annealing (RTA) process is conducted in-situ in a special anneal chamber. FIG. 7 is a cross-sectional view showing a configuration of an MTJ element 300 after performing the rapid thermal annealing (RTA) process on the TS layer. The rapid thermal anneal (RTA) induces a strong tensile strain in Fe or (Fe/Pt)$_n$ thin films on oxide substrate, and promotes (100) ordering or texture in Fe or (Fe/Pt)$_n$ films. Once an L10 superlattice (100) textured (Fe/Pt)$_n$ is formed, it provides an extra high PMA to the cube-textured reference layer.

Figure 8:
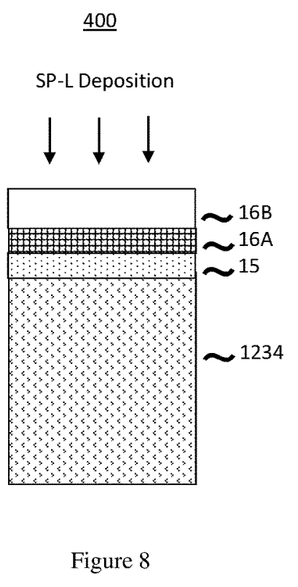
FIG. 8 is a cross-sectional view showing a configuration of a pMTJ element 400 after depositing the spin polarization layer (SP-L) on the RTA-treated or FQ-treated texture starting layer.
Figure 9:
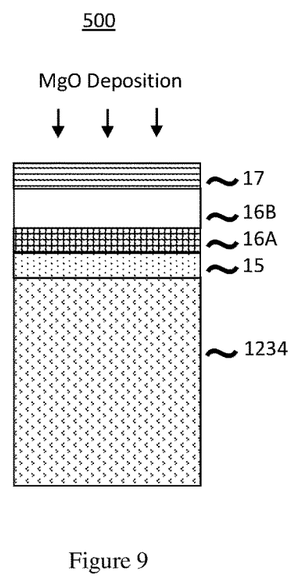
FIG. 9 is a cross-sectional view showing a configuration of a pMTJ element 500 after depositing the tunnel barrier layer on the spin polarization layer.
Figure 10:
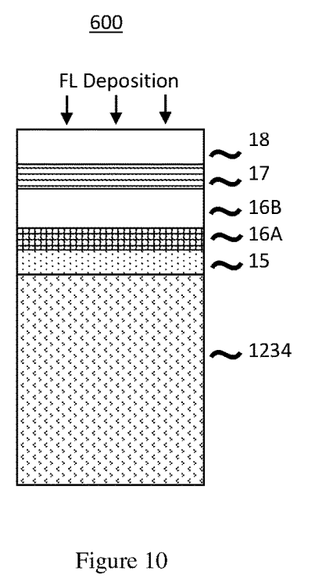
FIG. 10 is a cross-sectional view showing a configuration of a pMTJ element 600 after depositing the free layer on the tunnel barrier layer.

After the RTA, the TS layer serves as a highly (100) texture seed layer for the SP layer to achieve a BCC (100) texture. The SP layer is one selected from the group consisting of CoFe, CoFe/Fe, (Fe/Pt)$_n$/CoFe, (Fe/Pd)$_n$/CoFe, (Fe/Pt)$_n$/CoFe/Fe and (Fe/Pd)$_n$/CoFe/Fe. FIG. 8 is a cross-sectional view showing a configuration of an MTJ element 400 after depositing the SP layer (16B) on the RTA-treated TS layer (16A). It is important to note that the cube-textured reference is totally boron-free. FIG. 9 is a cross-sectional view showing a configuration of an MTJ element 500 after depositing the tunnel barrier layer (17) on the reference layer that consists of the TS layer (16A) and the SP layer (16B). The tunnel barrier is made of MgO, MgZnO, MgAl$_x$O$_y$, or ZnO. FIG. 10 is a cross-sectional view showing a configuration of an MTJ element 600 after depositing the free layer (18) on the tunnel barrier layer. The free layer can be selected among CoFe, Fe/CoFe, CoFe/Fe, Fe/CoFe/Fe with a thickness between 1-1.6 nm. An RTA process can be used for the formation of the free layer. For example, when the free layer is a bi-layer of Fe/CoFe, an RTA is preferably used after the deposition of the Fe sub-layer so that the Fe sub-layer is BCC (100) textured, and the CoFe sub-layer can grow epitaxially with a BCC (100) texture. In the first embodiment, boron-free pMTJ elements are formed, which is very different from the conventional pMTJ in the prior art.

Second Embodiment of Forming a pMTJ Element Having a Cube-Textured Reference Layer After forming the pSAF stack (1234), a metal layer (15M) is deposited on top of the pSAF, as shown in FIG. 5A, according to the second embodiment. The material for the metal layer can be one selected from the group consisting of alkaline metals, transition metals, and alloy. Preferably, the metal layer is made of Ni, Co, Fe, FeCo, NiFe, CoNi, Mn, Mg, MgZn, Zn or Cd. The thickness of the metal layer is no more than 1.0 nm, preferably no more than 0.5 nm.

FIG. 5B is a cross-sectional view showing a configuration of an MTJ element 202 after oxidizing the metal layer with an oxygen gas flow or an oxygen-containing gas flow to form an OB layer (15), according to the second embodiment. FIG. 5C is a cross-sectional view showing a configuration of an MTJ element 202 after depositing a TS layer (16A), according to the second embodiment. The TS layer is preferred to be one selected from the group consisting of Fe, FeCo, Co, $(Fe/Co)_n$ and $(Fe/Pt)_n$. The TS layer is formed by direct deposition on the OB layer with an ultra-low deposition rate of no more than 0.5 angstrom per second, preferably, with an ultra-low deposition rate of no more than 0.1 angstrom per second. After depositing the TS layer, a fast quenching (FQ) process is conducted in-situ by using a fast quenching chamber. FIG. 7 is a cross-sectional view showing a configuration of an MTJ element 300 after performing the fast quenching process on the TS layer. The fast quenching process induces a strong tensile strain in Fe thin films on oxide substrate, and promotes (100) ordering in Fe films Due to an excellent quality, a laser quenching process is preferred as the fast quenching process for this embodiment.

After the FQ process, the TS layer serves as a highly (100) texture seed layer for the SP layer to achieve a BCC (100) texture. The TS layer is one selected from the group consisting of CoFe, CoFe/Fe, $(Fe/Pt)_n$/CoFe, $(Fe/Pd)_n$/CoFe, $(Fe/Pt)_n$/CoFe/Fe, and $(Fe/Pd)_n$/CoFe/Fe. FIG. 8 is a cross-sectional view showing a configuration of an MTJ element 400 after depositing the SP layer on the FQ-treated TS layer. FIG. 9 is a cross-sectional view showing a configuration of an MTJ element 500 after depositing the tunnel barrier layer (17) on the cube-textured reference layer that consists of the TS layer (16A) and the SP layer (16B). The tunnel barrier is made of MgO, MgZnO, $MgAl_xO_y$ or ZnO. FIG. 10 is a cross-sectional view showing a configuration of an MTJ element 600 after depositing the free layer (18) on the tunnel barrier layer. The free layer can be selected among CoFe, Fe/CoFe, CoFeB, FeB, Fe/CoFeB and Fe/CoFeB/(W, Mo)/CoFeB with a B composition between 15-30% and preferably at 20% and a thickness between 1-2.6 nm. The cap layer (not shown) can be MgO or other metal oxide.

Third Embodiment of Forming a pMTJ Element Having a Cube-Textured Reference Layer In the third embodiment, the pSAF stack is directly oxidized after the pSAF stack is formed. FIG. 6A is a cross-sectional view showing a configuration of an MTJ element 202 after oxidizing the top surface of the pSAF stack with an oxygen gas flow or an oxygen-containing gas flow to form an OB layer (15), according to the third embodiment. FIG. 6B is a cross-sectional view showing a configuration of an MTJ element 202 after depositing a TS layer (16A), according to the second embodiment. The TS layer is preferred to be one selected from the group consisting of Fe, FeCo, Co and $[Fe/Pt]_n$. The TS layer is formed by direct deposition on the OB layer with an ultra-low deposition rate of no more than 0.5 angstrom per second, preferably, with an ultra-low deposition rate of no more than 0.1 angstrom per second. After the deposition of the TS layer, a rapid thermal annealing (RTA) process is conducted in-situ by a special anneal chamber. FIG. 7 is a cross-sectional view showing a configuration of an MTJ element 300 after performing the rapid thermal annealing (RTA) process on the TS layer. The rapid thermal anneal (RTA) induces a strong tensile strain in Fe thin films on oxide substrate, and promotes (100) ordering in Fe films.

After the RTA, the TS layer serves as a highly (100) texture seed layer for the SP layer to achieve a BCC (100) texture. The SP layer is one selected from the group consisting of CoFe, CoFe/Fe, $(Fe/Pt)_n$/CoFe, $(Fe/Pd)_n$/CoFe, $(Fe/Pt)_n$/CoFe/Fe, and $(Fe/Pd)_n$/CoFe/Fe. FIG. 8 is a cross-sectional view showing a configuration of an MTJ element 400 after depositing the SP layer (16B) on the RTP-treated TS layer. FIG. 9 is a cross-sectional view showing a configuration of an MTJ element 500 after depositing the tunnel barrier layer (17) on the cube-textured reference layer that consists of the TS layer (16A) and the SP layer (16B). The tunnel barrier is made of MgO, MgZnO, $MgAl_xO_y$ or ZnO. FIG. 10 is a cross-sectional view showing a configuration of an MTJ element 600 after depositing the free layer (18) on the tunnel barrier layer. The free layer can be selected among CoFe, Fe/CoFe, CoFeB, FeB, Fe/CoFeB with a B composition between 15-30% and preferably at 20% and a thickness between 1-1.6 nm.

As an option, The TS layer consists of at least a first sub-layers and a second sub-layer, wherein the first sub-layer is preferred to be one selected from the group consisting of Fe, FeCo, Co, $[Fe/Co]_n$ and $[Fe/Pt]_n$, and the second sub-layer contains Boron absorbing material, such as W and Mo. In this case, the SP layer can be one selected from the group consisting of CoFe, CoFeB, CoFe/Fe, CoFeB/Fe, $(Fe/Pt)_n$/CoFe, $(Fe/Pd)_n$/CoFe, $(Fe/Pt)_n$/CoFe/Fe, and $(Fe/Pd)_n$/CoFe/Fe.

The non-epitaxial texturing method described as above can be generalized to a tensile strain quenching (TSQ) technique which also comprises other quenching methods such as a pressure quenching (PQ) process. The TSQ technique can rapidly produce a tensile stress/strain in the TS film plane at a high temperature and correspondingly induce an energetically favored (100) texture, and have a successful retention of the (100) texture in the final TS layer as the temperature rapidly decreases to a room temperature. Other embodiments of this invention may include using any quenching technique, even at various processing stages. For example, the cube-textured reference layer may have the SP layer combined into the TS layer, and the TS layer is sandwiched between the OB layer and the tunnel barrier layer. The rapid thermal annealing, or the laser quenching, or any other TSQ techniques, is preferred to be applied after the formation of the tunnel barrier layer. Because the TS layer is sandwiched between two oxide layers, the quenching induced tensile strain is much larger than the one that a quenching process is applied immediately after the deposition of the TS layer. Similarly, the TSQ technique may also apply to formation of free layers in pMTJs. For example, if a free layer is boron-free and comprises at least one of an iron (Fe) layer, a cobalt (Co) layer, an alloy layer of cobalt iron (CoFe), an alloy layer of iron platinum (FePt), an alloy layer of iron palladium (FePd), a laminated layer of $(Fe/Co)_n$, a laminated layer of $(Fe/CoFe)_n$, a laminated layer of $(Fe/Pt)_n$ and a laminated layer of $(Fe/Pd)_n$, a TSQ process may be applied after formation of an oxide cap layer. If a free layer comprises a first free sub-layer which is boron-free and a second free sub-layer which contains boron, a TSQ process may be applied immediately after formation of the first free sub-layer.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of making a perpendicular magnetic tunnel junction (pMTJ) element, comprising:
    forming a magnetic pinning structure, wherein forming the magnetic pinning structure comprises:
        forming a perpendicular synthetic antiferromagnetic (pSAF) stack,
        forming an oxide buffer (OB) layer on top of the pSAF stack, and
        forming a cube-textured reference layer, wherein forming the cube-textured reference layer comprises depositing a texture starting (TS) layer on top of the oxide buffer layer;
    depositing a tunnel barrier layer on top of the magnetic pinning structure;
    depositing a magnetic free layer on top of the tunnel barrier layer and having a magnetic anisotropy perpendicular to a film surface and having a variable magnetization direction; and
further comprising: performing a tensile strain quenching (TSQ) process immediately after at least one of depositing the TS layer and depositing the tunnel barrier layer,
wherein performing said TSQ process induces a BCC or L10 superlattice structure and a (100) crystal texture in the TS layer.

2. The method of claim 1, wherein said pSAF stack has a seed-layer and at least two magnetic Co-containing multi-layer structures having perpendicular magnetic anisotropy (PMA) interleaved with at least one anti-ferromagnetic coupling (AFC) layer comprising Ru, Rh or Ir, preferred to be seed-layer/(Co/X)$_m$/Y/(Ru, Rh, or Ir)/Y/(X/Co)$_n$, where X represents Pt, Pd or Ni metals, m and n are non-negative integers (normally m>n), Y represents Co or CoFe.

3. The method of claim 1, wherein said OB layer is made of an oxide having a thickness of no more than 1.0 nm.

4. The method of claim 1, wherein said OB layer is made of an oxide having a thickness of no more than 0.5 nm.

5. The method of claim 1, wherein said TS layer comprises at least one of an iron (Fe) layer, a cobalt (Co) layer, an alloy layer of cobalt iron (CoFe), an alloy layer of iron platinum (FePt), an alloy layer of iron palladium (FePd), a laminated layer of (Fe/Co)$_n$, a laminated layer of (Fe/CoFe)$_n$, a laminated layer of (Fe/Pt)$_n$, and a laminated layer of (Fe/Pd)$_n$, wherein n is a lamination number.

6. The method of claim 1, forming said cube-textured reference layer further comprises: depositing a spin polarization (SP) layer directly on top of said TS layer, wherein said SP layer has a BCC structure and a (100) crystal texture, and comprises at least one of an iron (Fe) layer, a cobalt (Co) layer, an alloy layer of cobalt iron (CoFe), a laminated layer of (Co/Fe)$_n$, a laminated layer of (Fe/CoFe)$_n$, a laminated layer of (Co/CoFe)$_n$, a laminated layer of (Fe/Pt)$_n$ and a laminated layer of (Fe/Pd)$_n$, wherein n is a lamination number.

7. The method of claim 1, wherein said tunnel barrier layer comprises one of MgO, MgAl$_2$O$_4$, Mg$_x$Zn$_{(1-x)}$O or ZnO, wherein x is between 0 and 1.

8. The method of claim 1, wherein said TSQ process comprises at least one of: a rapid thermal annealing (RTA) process, a fast quenching (FQ) process, a laser quenching (LQ) process, a pressure quenching (PQ) process, and any other quenching process.

9. The method of claim 1, wherein said OB layer is made of an oxide having a rocksalt crystalline structure.

10. The method of claim 1, wherein said OB layer is an oxide selected from NiO, CoO, FeO, FeCoO$_2$, NiFeO$_2$, CoNiO$_2$, MnO, CrO, VO, TiO, MgO, Mg$_x$Zn$_{(1-x)}$O, ZnO and CdO, wherein x is between 0 and 1.

11. The method of claim 5, wherein said TS layer further comprises a boron absorbing layer, wherein the boron absorbing layer is a thin layer of metal or alloy containing W, Mo, Mg, or Ta.

12. The method of claim 6, wherein said SP layer further comprises at least one of an alloy layer of cobalt iron boron (CoFeB), an alloy layer of cobalt boron (CoB), an alloy layer of iron boron (FeB).

13. The method of claim 1, wherein said tunnel barrier layer comprises a rocksalt crystalline having a (100) texture.

14. The method of claim 1, wherein said magnetic free layer comprises a first free sub-layer and a second free sub-layer, wherein the first free sub-layer is formed by PVD or CVD deposition having a deposition rate no more than 0.5 angstrom per second, preferably no more than 0.1 angstrom per second.

15. The method of claim 1, wherein said OB layer is formed by a direct deposition, or a two-step sequential process comprising: depositing a metal layer and oxidizing the metal layer.

16. The method of claim 1, wherein said OB layer is formed by directly oxidizing the top surface of the pSAF stack.

17. The method of claim 8, wherein said rapid thermal annealing (RTA) process has a heating rate of at least 20 degree Kelvin per second.

18. The method of claim 8, wherein said fast quenching (FQ) process has a heating rate of at least 20 degree Kelvin per second, and said fast quenching (FQ) process is preferred to be a laser quenching process.

19. The method of claim 1, wherein said TS layer is formed by PVD or CVD deposition having a deposition rate no more than 0.5 angstrom per second.

20. The method of claim 1, wherein said TS layer is formed by PVD or CVD deposition having a deposition rate no more than 0.1 angstrom per second.

* * * * *